United States Patent
Cao et al.

(10) Patent No.: US 11,520,060 B2
(45) Date of Patent: Dec. 6, 2022

(54) RADIATION DETECTORS WITH SCINTILLATORS

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/471,753

(22) Filed: Sep. 10, 2021

(65) Prior Publication Data

US 2021/0405219 A1 Dec. 30, 2021

Related U.S. Application Data

(63) Continuation of application No. PCT/CN2019/080406, filed on Mar. 29, 2019.

(51) Int. Cl.
*G01T 1/20* (2006.01)
*H01L 31/14* (2006.01)

(52) U.S. Cl.
CPC .......... *G01T 1/2018* (2013.01); *G01T 1/2002* (2013.01); *H01L 31/145* (2013.01)

(58) Field of Classification Search
CPC .... G01T 1/2018; G01T 1/2002; H01L 31/145
See application file for complete search history.

(56) References Cited

U.S. PATENT DOCUMENTS

| 4,845,363 | A | 7/1989 | Akai | |
|---|---|---|---|---|
| 2010/0014631 | A1* | 1/2010 | Sonsky | G01T 1/2018 378/19 |
| 2010/0320391 | A1* | 12/2010 | Antonuk | H01L 27/14636 250/366 |
| 2010/0320556 | A1* | 12/2010 | Tredwell | H01L 31/101 257/443 |

(Continued)

FOREIGN PATENT DOCUMENTS

| CN | 1957846 A | 5/2007 |
|---|---|---|
| CN | 102183777 A | 9/2011 |

(Continued)

OTHER PUBLICATIONS

Rocha, J. G., et al. "X-ray detector based on a bulk micromachined photodiode combined with a scintillating crystal." Journal of Micromechanics and Microengineering 13.4 (2003): S45.

*Primary Examiner* — Kiho Kim
(74) *Attorney, Agent, or Firm* — IPro, PLLC; Qian Gu

(57) ABSTRACT

Disclosed herein is radiation detector, comprising a first photodiode comprising a first junction; and a first scintillator, wherein a first point in a first plane and inside the first scintillator is essentially completely surrounded in the first plane by an intersection of the first plane and the first junction. The first junction is a p-n junction, a p-i-n junction, a heterojunction, or a Schottky junction. The radiation detector further comprises a first reflector configured to guide essentially all photons emitted by the first scintillator into the first photodiode. The first scintillator is essentially completely enclosed by the first reflector and the first photodiode.

34 Claims, 6 Drawing Sheets

(56) References Cited

U.S. PATENT DOCUMENTS

| | | | |
|---|---|---|---|
| 2011/0108733 A1* | 5/2011 | Menge | G01T 1/2018 250/370.08 |
| 2011/0174981 A1 | 7/2011 | Miess et al. | |
| 2015/0241570 A1* | 8/2015 | Perna | G01T 1/2002 250/366 |
| 2017/0082558 A1 | 3/2017 | Liu | |
| 2018/0136340 A1* | 5/2018 | Nelson | A61B 6/4241 |

FOREIGN PATENT DOCUMENTS

| | | | |
|---|---|---|---|
| CN | 106291654 A | | 1/2017 |
| CN | 106605157 A | | 4/2017 |
| JP | H02232977 A | | 9/1990 |
| JP | 2004125722 A | | 4/2004 |
| JP | 2010216893 A | * | 9/2010 |
| WO | 2018024681 A1 | | 2/2018 |

* cited by examiner

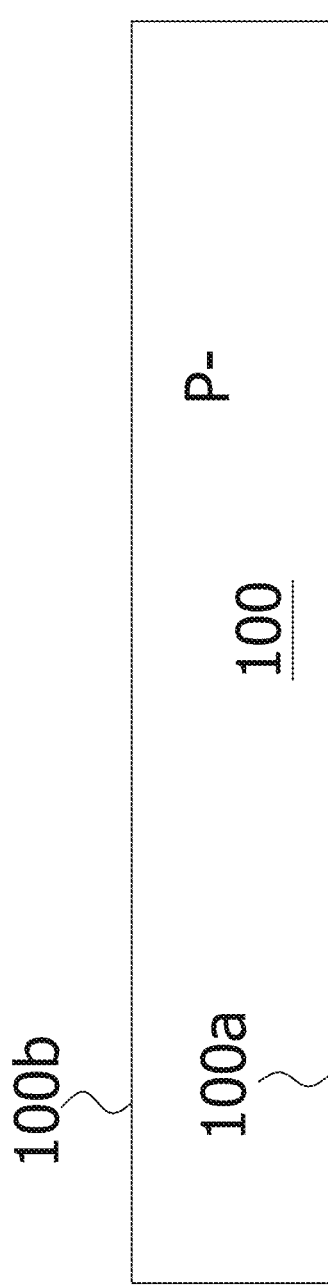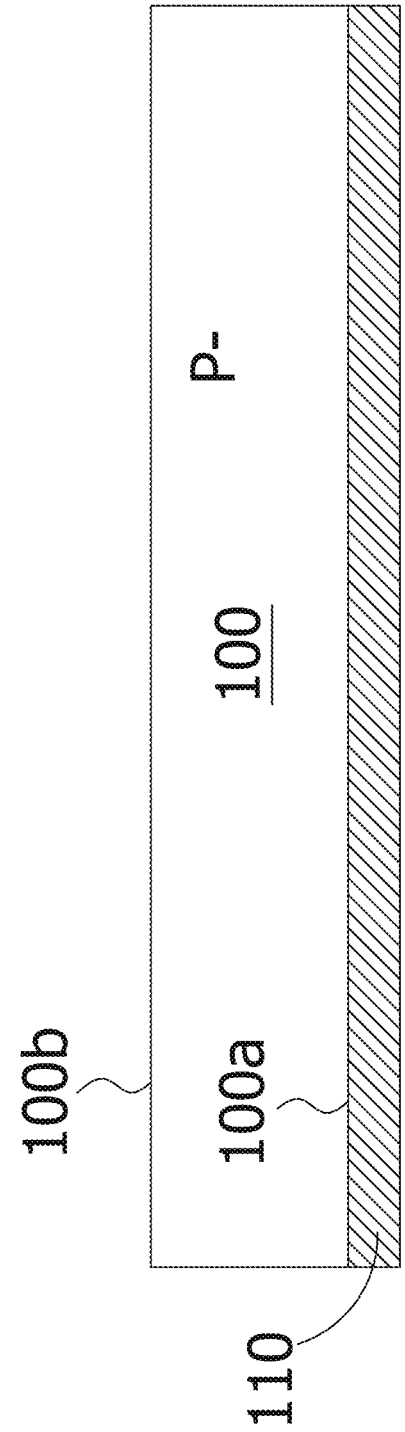

RADIATION DETECTORS WITH SCINTILLATORS

TECHNICAL FIELD

The disclosure herein relates to radiation detectors.

BACKGROUND

A radiation detector is a device that measures a property of a radiation. Examples of the property may include a spatial distribution of the intensity, phase, and polarization of the radiation. The radiation may be one that has interacted with an object. For example, the radiation measured by the radiation detector may be a radiation that has penetrated the object. The radiation may be an electromagnetic radiation such as infrared light, visible light, ultraviolet light, X-ray or γ-ray. The radiation may be of other types such as α-rays and β-rays. The radiation may comprise radiation particles such as photons (electromagnetic waves) and subatomic particles.

SUMMARY

Disclosed herein is a radiation detector comprising a first photodiode comprising a first junction and a first scintillator, wherein a first point in a first plane and inside the first scintillator is essentially completely surrounded in the first plane by an intersection of the first plane and the first junction.

According to an embodiment, the first junction is a p-n junction, a p-i-n junction, a heterojunction, or a Schottky junction.

According to an embodiment, the first photodiode is configured to measure a characteristic of photons emitted by the first scintillator and incident on the first photodiode.

According to an embodiment, the characteristic is energy, radiant flux, wavelength, or frequency.

According to an embodiment, the first scintillator is in direct physical contact with the first photodiode.

According to an embodiment, the first scintillator comprises sodium iodide.

According to an embodiment, the first scintillator comprises quantum dots.

According to an embodiment, the radiation detector further comprises a substrate, wherein the first scintillator is in a recess into a substrate surface of the substrate.

According to an embodiment, the recess has a shape of a truncated pyramid.

According to an embodiment, the first photodiode is in the substrate.

According to an embodiment, the first junction conforms to side and bottom walls of the recess.

According to an embodiment, the radiation detector further comprises a first reflector configured to guide photons emitted by the first scintillator into the first photodiode.

According to an embodiment, the first reflector is configured to reflect photons emitted by the first scintillator toward the first reflector.

According to an embodiment, the first reflector is not opaque to some radiation particles which are able to cause the first scintillator to emit photons when the radiation particles are incident on the first scintillator.

According to an embodiment, the first scintillator is essentially completely enclosed by the first reflector and the first photodiode.

According to an embodiment, the first reflector comprises a material selected from the group consisting of aluminum, silver, gold, copper, and any combinations thereof.

According to an embodiment, the first reflector is in direct physical contact with the first scintillator.

According to an embodiment, the first reflector is electrically connected to the first photodiode.

According to an embodiment, the radiation detector further comprises a second photodiode comprising a second junction and being adjacent to the first photodiode; and a second scintillator, wherein a second point in a second plane and inside the second scintillator is essentially completely surrounded in the second plane by an intersection of the second plane and the second junction.

According to an embodiment, the radiation detector further comprises a second reflector separate from the first reflector and configured to guide photons emitted by the second scintillator into the second photodiode.

According to an embodiment, the radiation detector further comprises a common electrode electrically connected to the first and second photodiodes.

Disclosed herein is a method comprising forming a first recess into a substrate surface of a substrate; forming a first junction in the substrate; and forming a first scintillator in the first recess, wherein a first point in a first plane and inside the first scintillator is essentially completely surrounded in the first plane by an intersection of the first plane and the first junction.

According to an embodiment, the first junction is a p-n junction, a p-i-n junction, a heterojunction, or a Schottky junction.

According to an embodiment, a first photodiode which comprises the first junction is configured to measure a characteristic of photons emitted by the first scintillator and incident on the first photodiode.

According to an embodiment, the characteristic is energy, radiant flux, wavelength, or frequency.

According to an embodiment, the first junction conforms to side and bottom walls of the first recess.

According to an embodiment, said forming the first junction comprises ion implantation.

According to an embodiment, said forming the first scintillator in the first recess comprises forming a scintillator layer on the substrate surface of the substrate; and polishing a layer surface of the scintillator layer until the substrate surface is exposed to a surrounding ambient.

According to an embodiment, the method further comprises forming a first reflector on the first scintillator, wherein the first reflector is configured to guide photons emitted by the first scintillator into a first photodiode which comprises the first junction.

According to an embodiment, the first reflector is configured to reflect photons emitted by the first scintillator toward the first reflector.

According to an embodiment, the first reflector is not opaque to some radiation particles which are able to cause the first scintillator to emit photons when the radiation particles are incident on the first scintillator.

According to an embodiment, the first scintillator is essentially completely enclosed by the first reflector and the first photodiode.

According to an embodiment, the first reflector comprises a material selected from the group consisting of aluminum, silver, gold, copper, and any combinations thereof.

According to an embodiment, the first reflector is in direct physical contact with the first scintillator.

According to an embodiment, the first reflector is electrically connected to the first photodiode.

According to an embodiment, the method further comprises forming a second recess into the substrate surface of the substrate; forming a second junction in the substrate; and forming a second scintillator in the second recess, wherein a second point in a second plane and inside the second scintillator is essentially completely surrounded in the second plane by an intersection of the second plane and the second junction.

According to an embodiment, the method further comprises forming a second reflector on the second scintillator, wherein the second reflector is separate from the first reflector, and wherein the second reflector is configured to guide photons emitted by the second scintillator into a second photodiode which comprises the second junction.

BRIEF DESCRIPTION OF FIGURES

FIG. 1-FIG. 9 schematically show the structure, fabrication process and operation of a radiation detector, according to an embodiment.

DETAILED DESCRIPTION

Figure 3:
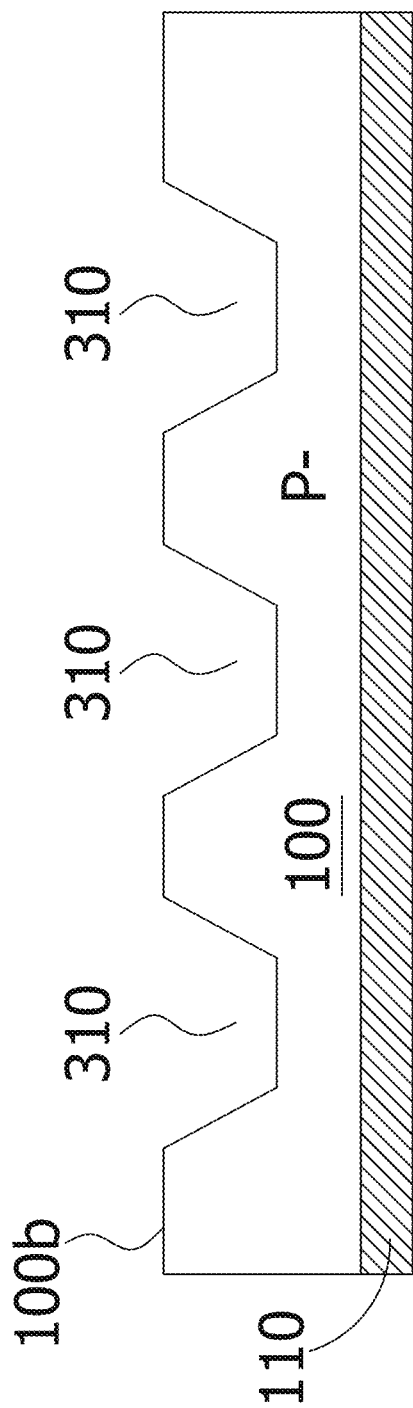

FIG. 1-FIG. 9 schematically show the structure, fabrication process and operation of a radiation detector 700, according to an embodiment. Specifically, with reference to FIG. 1, the fabrication process may start with a substrate 100. The substrate 100 may be a semiconductor substrate. For example, the substrate 100 may comprise silicon (Si) which may be lightly doped with P-type dopants such as boron atoms. The substrate 100 may have a surface 100a and a surface 100b. The surface 100a may be opposite from the surface 100b.

In an embodiment, a common electrode 110 may be formed on the surface 100a of the substrate 100. The common electrode 110 may comprise gold (Au). If gold is used, the common electrode 110 may be formed using a physical vapor deposition (PVD) process such as sputtering deposition.

With reference to FIG. 3, in an embodiment, recesses 310 may be formed into the surface 100b of the substrate 100. Specifically, in an embodiment, the recesses 310 may be formed as follows. An etch mask (e.g., a stencil or a pattern formed by lithography) with apertures may be placed on the surface 100b of the substrate 100 so that the apertures are at the locations where the recesses 310 are to be formed. Portions of the substrate 100 exposed through the apertures are etched away, resulting in the recesses 310 (FIG. 3). The etching may be an anisotropic wet etching using an etchant such as potassium hydroxide (KOH), or dry etching.

In an embodiment, the surface 100b of the substrate 100 may be a (100) silicon crystallographic plane. As a result, the recesses 310 resulting from the wet etching have truncated pyramid shapes with flat bottom walls and angled side walls as shown in FIG. 3. Other shapes of the recesses 310 may be possible depending on the method of forming the recesses 310.

Figure 4:
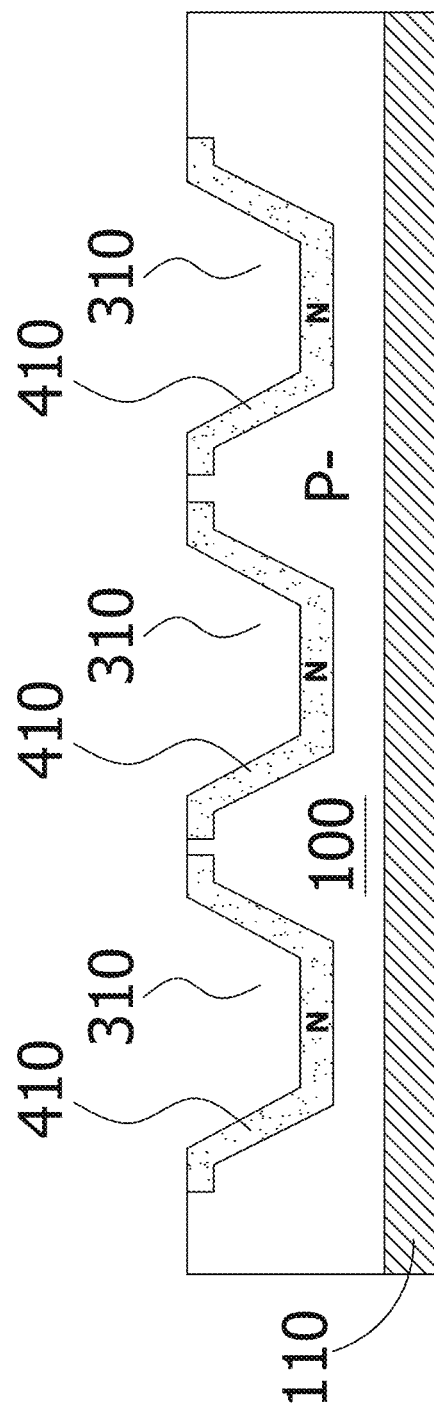

With reference to FIG. 4, in an embodiment, junctions may be formed in the substrate 100. For example, N-type Si regions 410 may be formed in the substrate 100 and on the side walls and bottom walls of the recesses 310. Specifically, the N-type Si regions 410 may be formed by an ion implantation process. More specifically, a stencil (not shown) with apertures may be placed on the surface 100b of the substrate 100 of FIG. 3 such that the recesses 310 are exposed through the apertures. Then, the stencil may be used as a shadow mask for doping the areas of the substrate 100 exposed through the apertures. The dopants used in the doping may be N-type dopants such as phosphorus atoms. The stencil blocks the dopant ions from reaching the area of the substrate 100 between the recesses 310 but exposes other areas of the substrate 100 (including the recesses 310) to dopant ions through the apertures. After the ion implantation, the stencil may be removed and an annealing process may be performed resulting in the N-type Si regions 410 (FIG. 4). In an alternative embodiment, instead of using the stencil, a pattern mask (not shown) may be used for the ion implantation process. The pattern mask may be formed on the substrate 100 of FIG. 3 by photolithography.

Figure 5:
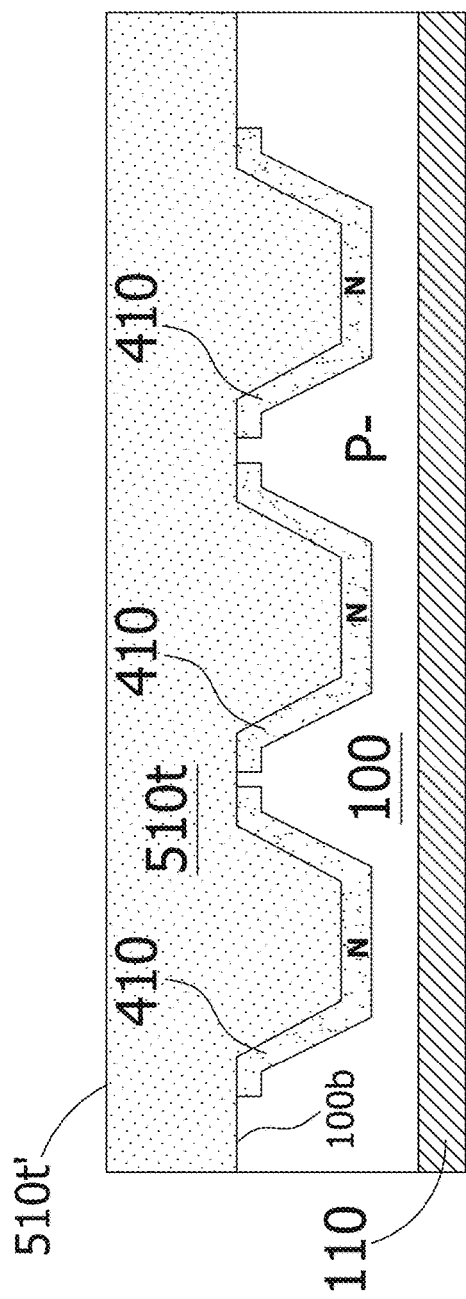

In an embodiment, scintillators may be formed in the recesses 310. Specifically, for example, a scintillator material may be deposited on the structure of FIG. 4 resulting in, as shown in FIG. 5, a scintillator layer 510t. The scintillator material emits photons (such as visible light photons) in response to radiation (e.g., X-ray) incident on the scintillator material. In an embodiment, the scintillator layer 510t may comprise sodium iodide (NaI) or quantum dots.

Figure 6:
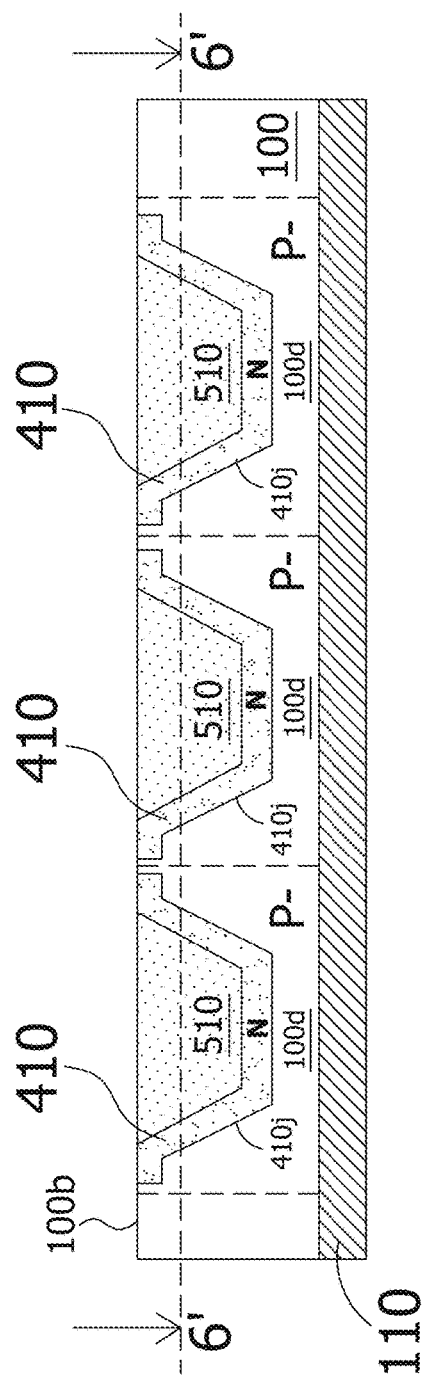
Figure 7:
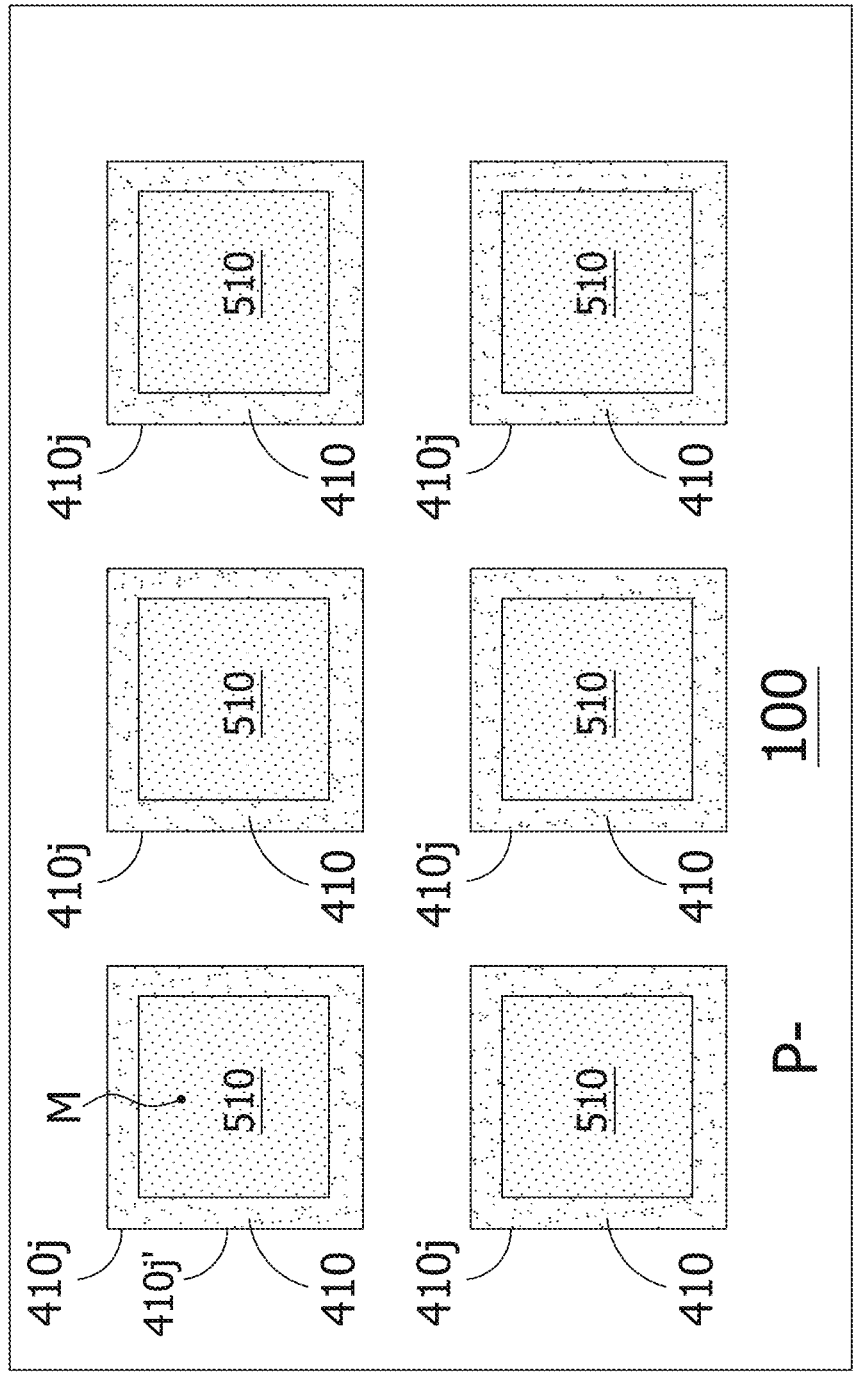

With reference to FIG. 5, in an embodiment, forming the scintillators may include polishing a surface 510t' of the scintillator layer 510t until the surface 100b of the substrate 100 is exposed to the surrounding ambient, resulting in, as shown in FIG. 6, scintillators 510 in the recesses 310 (FIG. 4). FIG. 7 schematically shows a cross-sectional view of the structure of FIG. 6 along a plane 6'-6'. In other words, FIG. 7 schematically shows a cross-sectional view of the structure of FIG. 6 across a plane 6'-6' which comprises the line 6'-6' and is perpendicular to the page of FIG. 6.

In FIG. 6, it should be noted that each N-type region 410 forms with a substrate portion 100d of the P-type substrate 100 a photodiode 410+100d which includes a p-n junction 410j at the interface of the N-type region 410 and the P-type substrate portion 100d. FIG. 6 shows 3 such photodiodes 410+100d. The p-n junction 410j may conform to the side and bottom walls of the recess 310 (FIG. 4) which the associated scintillator 510 now occupies.

In an embodiment, all photodiodes 410+100d may share (i.e., be electrically connected to) the common electrode 110. In FIG. 7 (i.e., in the plane 6'-6'), it should be noted that a point M in the plane 6'-6' and inside a scintillator 510 is essentially completely surrounded in the plane 6'-6' by an intersection 410j' of the plane 6'-6' and the p-n junction 410j of the associated photodiode 410+100d. "Essentially completely" means completely or almost completely.

Figure 8:
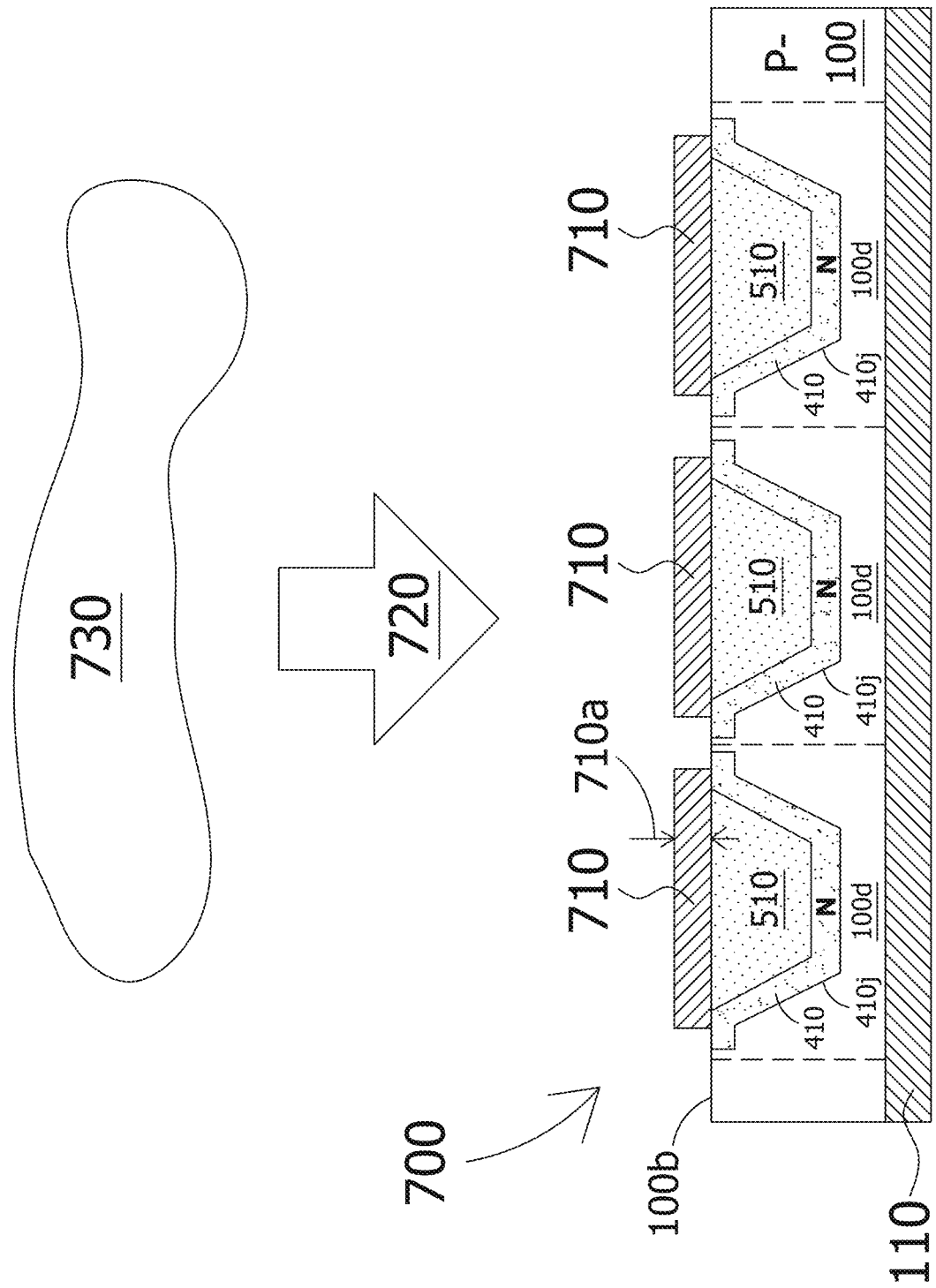

With reference to FIG. 8, in an embodiment, reflectors 710 may be formed on the scintillators 510, according to an embodiment. The reflectors 710 may be formed using a photolithographic process. In an embodiment, the material and thickness 710a of each reflector 710 may be such that the reflector 710 is not opaque to at least some radiation particles of a radiation 720 from an object 730. In an embodiment, the material and thickness 710a of each reflector 710 may be such that the reflector 710 reflects photons emitted by the associated scintillator 510 towards the reflector 710. Specifically, the reflectors 710 may comprise aluminum, silver, gold, copper, or any combinations thereof. The thickness 710a may be around 10 micrometers (μm).

In an embodiment, the reflectors 710 may be formed in direct physical contact one-to-one with the scintillators 510. In an embodiment, the reflectors 710 may be formed in direct physical contact one-to-one with the N-type regions 410 of the photodiodes 410+100d. As a result, each reflector 710 is electrically connected to the associated photodiode 410+100*d*. In an embodiment, the reflectors 710 may be formed such that each scintillator 510 is essentially completely enclosed by an N-type Si region 410 and a reflector 710. In other words, each scintillator 510 is essentially completely enclosed by a photodiode 410+100*d* and a reflector 710.

Figure 9:
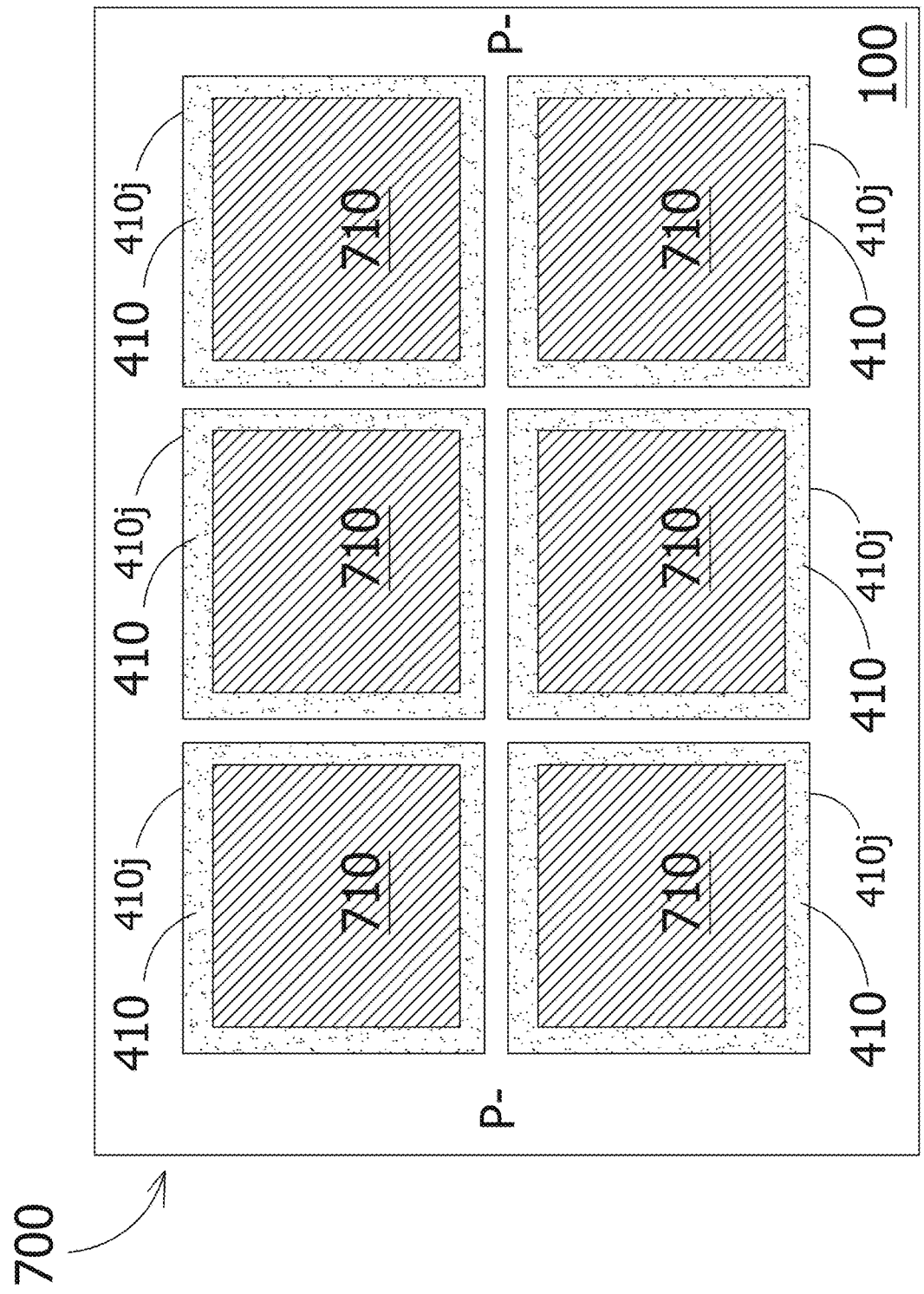

Specifically, in an embodiment, the reflectors 710 may be formed as follows. A photoresist layer (not shown) may be formed on the structure of FIG. 6. The photoresist layer may be patterned exposing the scintillators 510 and the N-type Si regions 410 but covering areas between the N-type Si regions 410. Then, a physical vapor deposition process (e.g., sputter deposition) may be performed so as to deposit a suitable material such as aluminum (Al) on surfaces of the structure of FIG. 6 not covered by the patterned photoresist layer, resulting in the reflectors 710 (FIG. 8). After that, the patterned photoresist layer may be removed resulting in the radiation detector 700 of FIG. 8. FIG. 9 schematically shows a top view of the radiation detector 700 of FIG. 8.

In an embodiment, each photodiode 410+100*d* may be configured to detect radiation particles incident thereon (e.g., incident photons emitted by the associated scintillator 510) and may be configured to measure a characteristic (e.g., energy, radiant flux, wavelength, and frequency) of the incident radiation particles. In an embodiment, a characteristic (e.g., total energy) of the radiation particles incident on the associated scintillator 510 may be determined based on the measured characteristic (e.g., total energy) of the photons emitted by the associated scintillator 510 and incident on the photodiode 410+100*d*.

For example, each photodiode 410+100*d* may be configured to count numbers of radiation particles incident thereon whose energy falls in a plurality of bins of energy, within a period of time. All the photodiodes 410+100*d* may be configured to count the numbers of radiation particles incident thereon within a plurality of bins of energy within the same period of time. When the incident radiation particles have similar energy, the photodiodes 410+100*d* may be simply configured to count numbers of radiation particles incident thereon within a period of time, without measuring the energy of the individual radiation particles.

Each photodiode 410+100*d* may have its own analog-to-digital converter (ADC) configured to digitize an analog signal representing the energy of an incident radiation particle into a digital signal, or to digitize an analog signal representing the total energy of a plurality of incident radiation particles into a digital signal. The photodiodes 410+100*d* may be configured to operate in parallel. For example, when one photodiode 410+100*d* measures an incident radiation particle, another photodiode 410+100*d* may be waiting for a radiation particle to arrive. The photodiodes 410+100*d* may not have to be individually addressable.

The radiation detector 700 described here may have applications such as in an X-ray telescope, X-ray mammography, industrial X-ray defect detection, X-ray microscopy or microradiography, X-ray casting inspection, X-ray non-destructive testing, X-ray weld inspection, X-ray digital subtraction angiography, etc. It may be suitable to use this radiation detector 700 in place of a photographic plate, a photographic film, a PSP plate, an X-ray image intensifier, or another semiconductor X-ray detector.

In an embodiment, an operation of the radiation detector 700 may be as follows. Assume that the radiation detector 700 is exposed to the radiation 720 (e.g., X-ray) that have earlier interacted with the object 730 (e.g., an animal). As a result, the radiation 720 carries information of the object 730.

For radiation particles of the radiation 720 that propagate in the direction of a photodiode 410+100*d* of the radiation detector 700, because the reflector 710 associated with the photodiode is not opaque to at least a portion of the radiation 720 as described above, at least some of these radiation particles pass through the associated reflector 710 and enter the scintillator 510 associated with the photodiode. In response, the associated scintillator 510 emits photons in directions.

Because each scintillator 510 is essentially completely enclosed by the associated reflector 710 and the associated photodiode 410+100*d* as described above, each photon emitted by the scintillator 510 may either enter the photodiode 410+100*d* with no interaction with the reflector 710 or bounce off the reflector 710 before entering the photodiode 410+100*d*. In other words, all or almost all the photons emitted by the scintillator 510 are prevented by the reflector 710 from not entering the photodiode 410+100*d*. In yet other words, the reflector 710 all or almost all the photons emitted by the scintillator 510 into the photodiode 410+100*d*.

When the photons emitted by the scintillators 510 are guided by the reflectors 710 respectively into the photodiodes 410+100*d*, these photons create in the photodiodes electrical signals that represent the information (e.g., an image) of the object 730. In an embodiment, these electrical signals may be read out of the photodiodes and processed by the electronics structures of the radiation detector 700 before being sent out to a computer (not shown) for further processing and displaying the information (e.g., an image) of the object 730.

In summary, when the radiation detector 700 is exposed to the radiation 720 which has earlier interacted with the object 730, at least some radiation particles of the radiation 720 propagating in the direction of each photodiode 410+100*d* pass through the associated reflector 710 and cause the associated scintillator 510 to emit photons in all directions. These emitted photons are guided by the associated reflector 710 into the photodiode resulting in the corresponding electrical signal in the photodiode. The resulting electrical signals in the photodiodes provide some information (e.g., an image) of the object 730.

In the embodiments described above, with reference to FIG. 8 and FIG. 9, the substrate 100 is doped P-type while the regions 410 are doped N-type. In an alternative embodiment, the substrate 100 may be doped N-type while the regions 410 may be doped P-type.

In the embodiments described above, the junction of each photodiode is a p-n junction. In general, the junction of each photodiode may be a p-n junction, a p-i-n junction, a heterojunction, a Schottky junction, or any suitable junction.

In the embodiments described above, the reflectors 710 are present in the radiation detector 700. In an alternative embodiment, the reflectors 710 may be omitted (i.e., not present) in the radiation detector 700.

In the embodiments described above, with reference to FIG. 6, FIG. 7, and FIG. 8, the radiation detector 700 includes 6 photodiodes 410+100*d* arranged in an array of 2 rows and 3 columns. In general, the radiation detector 700 may include any number of photodiodes 410+100*d* arranged in any way.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A radiation detector, comprising:
a first photodiode comprising a first junction;
a first scintillator;
a first reflector configured to guide photons emitted by the first scintillator into the first photodiode; and
wherein a first point in a first plane and inside the first scintillator is essentially completely surrounded in the first plane by an intersection of the first plane and the first junction;
wherein the first reflector is electrically connected to the first photodiode.

2. The radiation detector of claim 1, wherein the first junction is a p-n junction, a p-i-n junction, a heterojunction, or a Schottky junction.

3. The radiation detector of claim 1, wherein the first photodiode is configured to measure a characteristic of photons emitted by the first scintillator and incident on the first photodiode.

4. The radiation detector of claim 3, wherein the characteristic is energy, radiant flux, wavelength, or frequency.

5. The radiation detector of claim 1, wherein the first scintillator is in direct physical contact with the first photodiode.

6. The radiation detector of claim 1, wherein the first scintillator comprises sodium iodide.

7. The radiation detector of claim 1, wherein the first scintillator comprises quantum dots.

8. The radiation detector of claim 1, further comprising a substrate, wherein the first scintillator is in a recess into a substrate surface of the substrate.

9. The radiation detector of claim 8, wherein the recess has a shape of a truncated pyramid.

10. The radiation detector of claim 8, wherein the substrate comprises silicon.

11. The radiation detector of claim 8, wherein the first photodiode is in the substrate.

12. The radiation detector of claim 8, wherein the first junction conforms to side and bottom walls of the recess.

13. The radiation detector of claim 1, wherein the first reflector is configured to reflect photons emitted by the first scintillator toward the first photodiode.

14. The radiation detector of claim 1, wherein the first reflector is not opaque to some radiation particles which are able to cause the first scintillator to emit photons when the radiation particles are incident on the first scintillator.

15. The radiation detector of claim 1, wherein the first scintillator is essentially completely enclosed by the first reflector and the first photodiode.

16. The radiation detector of claim 1, wherein the first reflector comprises a material selected from the group consisting of aluminum, silver, gold, copper, and any combinations thereof.

17. The radiation detector of claim 1, wherein the first reflector is in direct physical contact with the first scintillator.

18. The radiation detector of claim 1, further comprising:
a second photodiode comprising a second junction and being adjacent to the first photodiode; and
a second scintillator,
wherein a second point in a second plane and inside the second scintillator is essentially completely surrounded in the second plane by an intersection of the second plane and the second junction.

19. The radiation detector of claim 18, further comprising a second reflector configured to guide photons emitted by the second scintillator into the second photodiode.

20. The radiation detector of claim 18, further comprising a common electrode electrically connected to the first and second photodiodes.

21. A method, comprising:
forming a first recess into a substrate surface of a substrate;
forming a first junction in the substrate;
forming a first scintillator in the first recess; and
forming a first reflector on the first scintillator, wherein the first reflector is configured to guide photons emitted by the first scintillator into a first photodiode which comprises the first junction;
wherein the first reflector is electrically connected to the first photodiode;
wherein a first point in a first plane and inside the first scintillator is essentially completely surrounded in the first plane by an intersection of the first plane and the first junction.

22. The method of claim 21, wherein the first junction is a p-n junction, a p-i-n junction, a heterojunction, or a Schottky junction.

23. The method of claim 21, wherein a first photodiode which comprises the first junction is configured to measure a characteristic of photons emitted by the first scintillator and incident on the first photodiode.

24. The method of claim 23, wherein the characteristic is energy, radiant flux, wavelength, or frequency.

25. The method of claim 21, wherein the first junction conforms to side and bottom walls of the first recess.

26. The method of claim 21, wherein said forming the first junction comprises ion implantation.

27. The method of claim 21, wherein said forming the first scintillator in the first recess comprises:
forming a scintillator layer on the substrate surface of the substrate; and
polishing a layer surface of the scintillator layer until the substrate surface is exposed to a surrounding ambient.

28. The method of claim 21, wherein the first reflector is configured to reflect photons emitted by the first scintillator toward the first photodiode.

29. The method of claim 21, wherein the first reflector is not opaque to some radiation particles which are able to cause the first scintillator to emit photons when the radiation particles are incident on the first scintillator.

30. The method of claim 21, wherein the first scintillator is essentially completely enclosed by the first reflector and the first photodiode.

31. The method of claim 21, wherein the first reflector comprises a material selected from the group consisting of aluminum, silver, gold, copper, and any combinations thereof.

32. The method of claim 21, wherein the first reflector is in direct physical contact with the first scintillator.

33. The method of claim 21, further comprising:
forming a second recess into the substrate surface of the substrate;
forming a second junction in the substrate; and
forming a second scintillator in the second recess,
wherein a second point in a second plane and inside the second scintillator is essentially completely surrounded in the second plane by an intersection of the second plane and the second junction.

34. The method of claim 33, further comprising forming a second reflector on the second scintillator, wherein the second reflector is configured to guide photons emitted by the second scintillator into a second photodiode which comprises the second junction.

\* \* \* \* \*